United States Patent
Obermaier et al.

(10) Patent No.: US 7,237,211 B2
(45) Date of Patent: Jun. 26, 2007

(54) METHOD FOR REDUCING THE EVALUATION OUTLAY IN THE MONITORING OF LAYOUT CHANGES FOR SEMICONDUCTOR CHIPS

(75) Inventors: Werner Obermaier, Xi'an (CN); Andreas Baenisch, Munich (DE); Uwe Mueller, Munich (DE)

(73) Assignee: Infineon Technologies AG, Munich (DE)

( * ) Notice: Subject to any disclaimer, the term of this patent is extended or adjusted under 35 U.S.C. 154(b) by 70 days.

(21) Appl. No.: 11/248,605

(22) Filed: Oct. 12, 2005

(65) Prior Publication Data

US 2006/0080624 A1 Apr. 13, 2006

(30) Foreign Application Priority Data

Oct. 13, 2004 (DE) .................. 10 2004 050 028

(51) Int. Cl.
*G06F 17/50* (2006.01)
(52) U.S. Cl. .................. 716/5; 716/9; 716/10; 716/11
(58) Field of Classification Search .................. 716/5, 716/9, 10
See application file for complete search history.

(56) References Cited

U.S. PATENT DOCUMENTS

| | | | | |
|---|---|---|---|---|
| 5,450,331 A * | 9/1995 | Lin et al. | | 716/5 |
| 5,706,295 A * | 1/1998 | Suzuki | | 714/724 |
| 6,011,911 A * | 1/2000 | Ho et al. | | 716/5 |
| 6,115,546 A * | 9/2000 | Chevallier et al. | | 716/5 |
| 6,311,311 B1 * | 10/2001 | Swaney et al. | | 716/4 |
| 6,611,946 B1 * | 8/2003 | Richardson et al. | | 716/5 |
| 6,634,018 B2 * | 10/2003 | Randall et al. | | 716/19 |
| 6,782,520 B1 * | 8/2004 | Igusa et al. | | 716/9 |
| 6,816,997 B2 * | 11/2004 | Teh et al. | | 716/5 |
| 6,904,587 B2 * | 6/2005 | Tsai et al. | | 716/19 |
| 6,922,823 B2 * | 7/2005 | Tester | | 716/10 |
| 7,076,759 B2 * | 7/2006 | Jurgens et al. | | 716/11 |
| 2005/0081167 A1 * | 4/2005 | Kever et al. | | 716/2 |
| 2006/0136855 A1 * | 6/2006 | Hoff et al. | | 716/11 |
| 2006/0184908 A1 * | 8/2006 | Minami et al. | | 716/10 |

FOREIGN PATENT DOCUMENTS

| | | | |
|---|---|---|---|
| JP | 03263180 A | * | 11/1991 |
| JP | 06-083906 | | 3/1994 |
| JP | 06-326191 | | 11/1994 |
| JP | 08101859 A | * | 4/1996 |
| JP | 2003-337843 | | 11/2003 |

* cited by examiner

*Primary Examiner*—Phallaka Kik
*Assistant Examiner*—Patrick Sandoval
(74) *Attorney, Agent, or Firm*—Slater & Matsil, L.L.P.

(57) ABSTRACT

In a method for monitoring layout changes for semiconductor chips, a first group of error data is generated by comparing a first layout with wiring and layout rules. A second group of error data is generated by comparing a second layout with the wiring and layout rules, the second layout being generated from layout changes of the first layout. The first group of error data is compared to the second group of error data and only error data that are different in the first and second groups is output for evaluation.

15 Claims, 2 Drawing Sheets

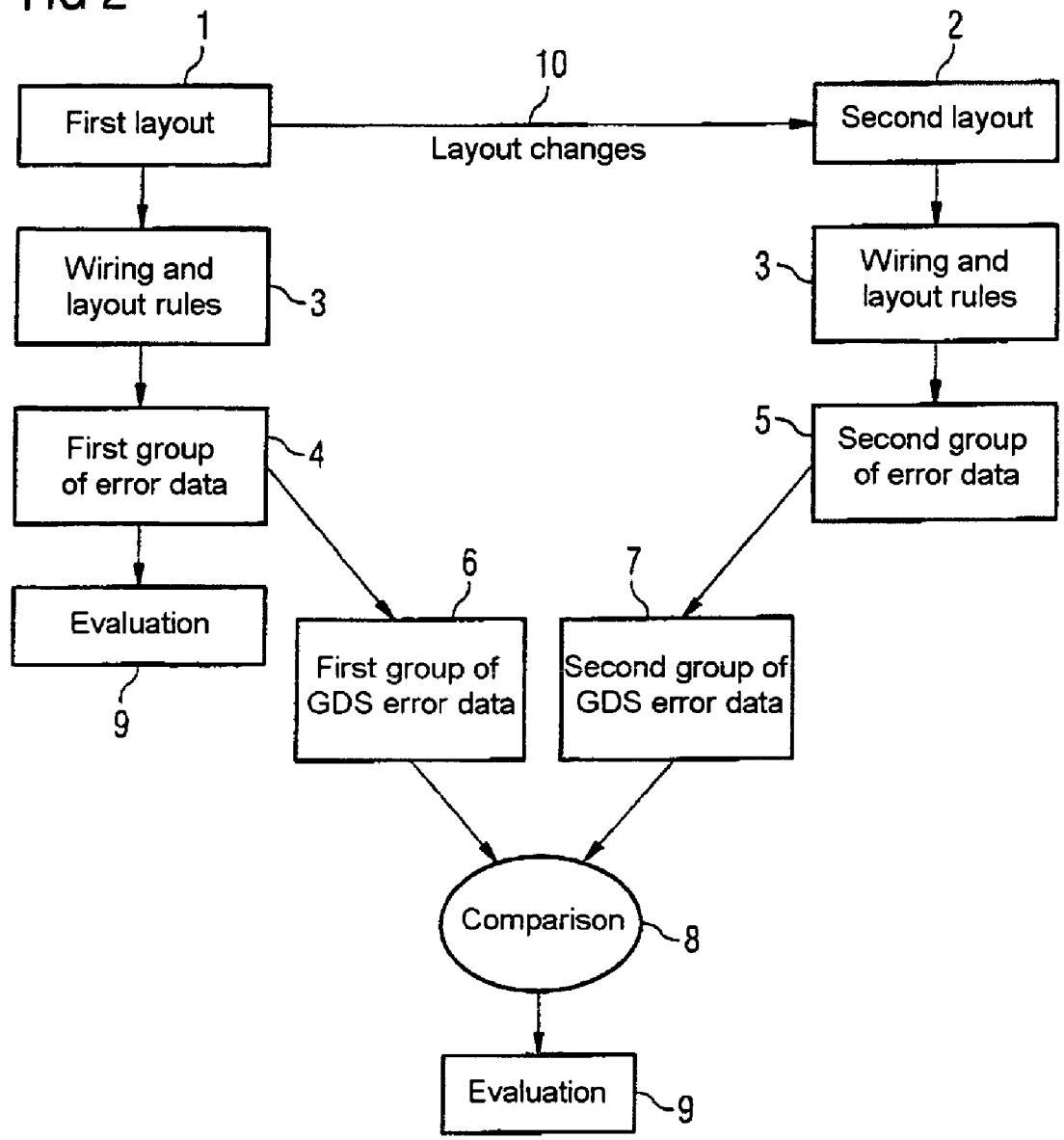

METHOD FOR REDUCING THE EVALUATION OUTLAY IN THE MONITORING OF LAYOUT CHANGES FOR SEMICONDUCTOR CHIPS

This application claims priority to German Patent Application 10 2004 050 028.2-33, which was filed Oct. 13, 2004, and is incorporated herein by reference.

TECHNICAL FIELD

The invention relates to a method for reducing the evaluation outlay in the monitoring of layout changes for semiconductor chips, in which error data are generated from layout data by means of a comparison with defined wiring and layout rules, the error data being evaluated in a subsequent step.

BACKGROUND

Chip development involves passing through a multiplicity of production stages until a functional semiconductor chip is present. Development is a lengthy process that is always beset by errors, in particular as a result of the incorrect, unforeseeable interaction of the components and thus necessitates renewed development cycles.

In general, a first development step involves mapping the functions in subcircuits, and this may be followed by simulation by means of suitable software. Even at this stage development errors can be identified and eliminated. The structures proceeding from the subcircuits are subsequently refined further and further, so that, according to the present theoretical model, the hardware architecture is implemented in a layout design.

This generated layout design is compared with the applicable wiring and layout rules (DRC=Design Rule Control) with deviations from the rules being output as error data. These deviations may be brought about by exceptions in the layout configuration, so-called "dummy errors", which are not implemented in the test algorithm, or by genuine errors. By virtue of these possibilities, the number of error messages is very high. For the further layout processing, however, it is essential to test all of the error data.

Proceeding from this first layout, a second layout design arises as a result of the elimination of the errors found or necessary alterations in the circuit arrangement, for example because predetermined parameters are not achieved. In those cases, such a redesign involves making only comparatively small changes at specific levels. The subsequent comparison of the second layout design, also referred to as redesign layout verification, is likewise effected according to the above-mentioned wiring and layout rules. In this comparison, too, all the "dummy errors" are once again concomitantly registered in the error data and subsequently have to be checked. Consequently, the outlay for the evaluation of the error data is very high even after a small layout change.

In practice, a plurality of redesigns are normally necessary in order to attain an error-free layout, which leads to an increase in costs, in particular due to redundant error checking steps.

SUMMARY OF THE INVENTION

Consequently, embodiments of the invention provide a method for reducing the evaluation outlay in the monitoring of layout changes for semiconductor chips whereby the volume of data to be evaluated is reduced. In many cases, the reliability in the evaluation is increased and the outlay on costs for the evaluation is minimized.

According to a first embodiment of the invention, a method reduces the evaluation outlay in the monitoring of layout changes for semiconductor chips of the type mentioned in the introduction, by virtue of the fact that a first group of error data is generated in a first comparison of a first layout with the wiring and layout rules. A second group of error data is generated in a second comparison of a second layout, which is generated through layout changes of the first layout with the wiring and layout rules. From the first and from the second group of error data, by means of a comparison of the two groups of error data, only the error data that are different in the two groups of error data are determined and output for evaluation.

A first layout, created in a previous method step is checked for its correctness in accordance with the wiring and layout rules (DR=Design Rules). Error data are generated on account of this test. These error data contain the actual errors but also the dummy errors that are generated by means of exceptions not known to the test algorithm in the design rules. A check of all the error data generated is carried out and thus selects the actual errors in the design.

Proceeding from this first layout, a second layout is generated by means of one or more changes to the layout. In a further method step, the second layout is likewise tested in accordance with the wiring and layout rules. Error data are generated on account of this test, so that now a first group, associated with the first layout, and a second group, associated with the second layout, of error data have been generated.

In order to reduce the monitoring or testing outlay, a comparison of the two groups of error data is effected in accordance with the method. As a result of this comparison, the differences between the two groups of error data, which subsequently have to be subjected to a test, are determined and output. The testing of the errors that have already been tested in a previous method step is consequently obviated.

One refinement of the invention provides for the comparison to be effected by means of an exclusive-ORing of the two groups of error data.

In a first refinement of the method, the comparison of the two groups of error data is effected using an exclusive-ORing. The use of such a logic combination has the effect that when the data to be compared are identical in both groups of error data, no error is output. When the data to be compared are not identical, the error is output for subsequent evaluation. The value of data to be evaluated is consequently reduced since all error data that have already been evaluated in a previous method step and have not changed are excluded from the evaluation in accordance with the embodiment of the invention.

A further refinement of the invention provides for the comparison of the two groups of error data to be effected by means of a digital data comparison.

The comparison of the two groups of error data may be carried digitally by means of a suitable logic. A separate circuit arrangement designed for this comparison or a processor may be used for this purpose.

A particular embodiment of the invention provides for the comparison of the two groups of error data to be effected by means of an optical comparison.

The comparison of the two groups of error data may be effected optically by comparing two images that are each assigned to a specific layout. This optical comparison may be carried out manually or by means of image processing software suitable therefore.

One refinement of the invention provides for the data in the two groups of error data to be stored in the GDS format (GDS=Grid Description Section).

The error data may be stored in digital form in the GDS format, which is in widespread use for creating layouts and enables three-dimensional and multilayer layout representations. This data format affords the possibility of being able to visualize the data by means of a corresponding arrangement. Consequently, it is possible, for example, to check the error data or to carry out the comparison of the two groups of error data. Moreover, the GDS data format may also be processed digitally if the comparison is to be effected by means of a processor.

According to another embodiment, a semiconductor device can be made from a first layout. A first group of error data is generated by comparing the first layout with wiring and layout rules. A second layout is generated from the first layout and a second group of error data is generated by comparing the second layout with the wiring and layout rules. A comparison is performed between the first group of error data and the second group of error data and only error data that are different in the first and second groups is output. A final layout based at least in part on the outputted error data can then be generated and a semiconductor device fabricated based upon the final layout.

DESCRIPTION OF THE DRAWINGS

The invention will be explained in more detail below on the basis of an exemplary embodiment. In the associated drawings:

FIG. 2 shows a method sequence according to the invention.

Figure 1:
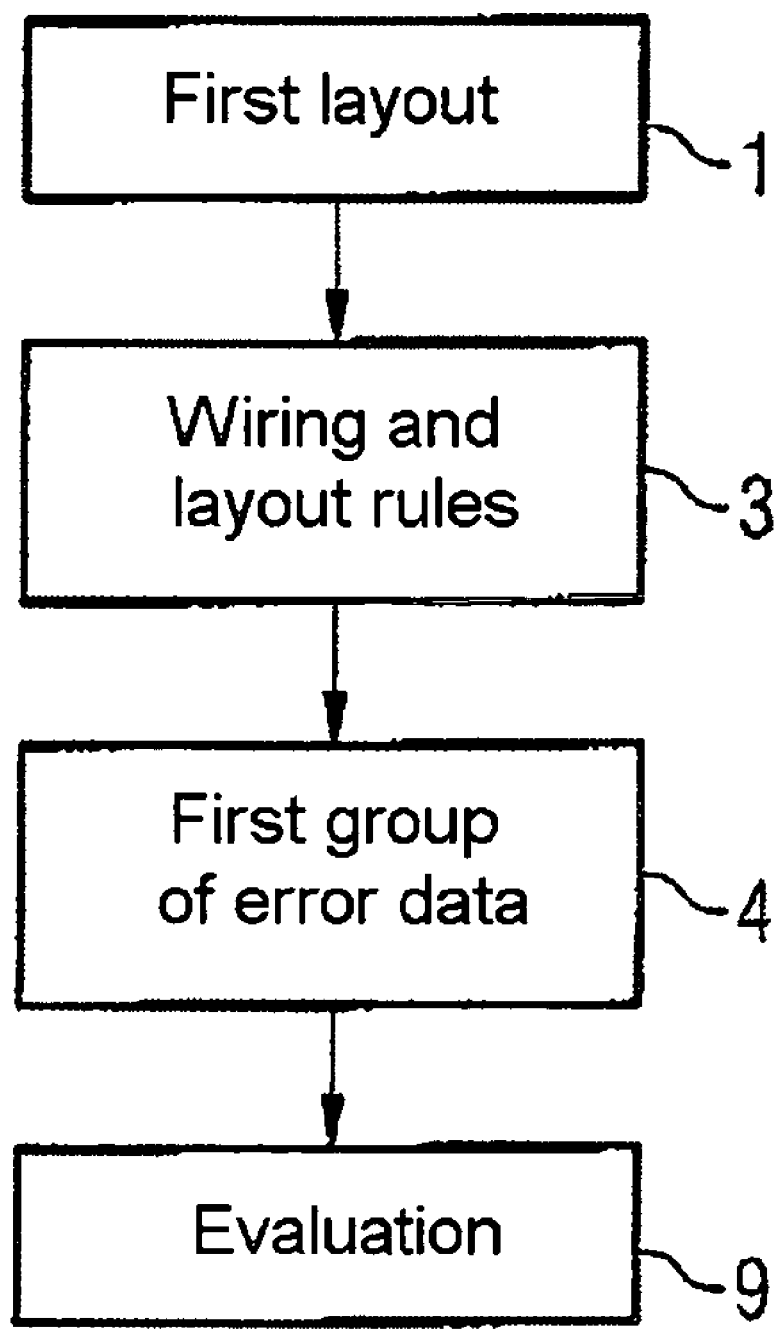
FIG. 1 shows a method sequence from the prior art.

The following list of reference symbols can be used in conjunction with the figures:

1 First layout
2 Second layout
3 Wiring and layout rules
4 First group of error data
5 Second group of error data
6 First groups of GDS error data
7 Second groups of GDS error data
8 Comparison
9 Evaluation
10 Layout changes

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1 illustrates the method sequence from the prior art. In this case, a first layout 1 is compared with the wiring and layout rules (DR=Design Rules) 3 and a first group of error data 4 are generated on account of this comparison. The group of error data generated in this way is subsequently evaluated by means of an evaluation operation 9. This method sequence is repeated for every further layout. Therefore, the repetitions are not specifically illustrated.

FIG. 2 illustrates the method sequence according to embodiments of the invention. In this method sequence too, a first group of error data 4 is generated proceeding from a first layout 1 by means of the wiring and layout rules 3. The evaluation 9 of the group of error data is then effected.

A second layout 2 is generated as a result of necessary layout changes 10 of the first layout 1. This layout 2 is also compared with the wiring and layout rules 3. A second group of error data 5 is generated as a result of this comparison. The two groups of error data 4 and 5 are stored for example in the GDS format 6 and 7 (GDS=Grid Description Section).

The two GDS error data groups 6 and 7 are subsequently processed by means of a comparison 8, which is realized by a logic exclusive-ORing, for example, and the outputting of the error data that differ between the two groups of GDS error data 6 and 7 for evaluation 9. In this case, the comparison 8 may also be carried out optically, the error data that differ between the groups of GDS error data 6 and 7 likewise being generated and evaluated. For this purpose, each group of GDS error data 6 and 7 may be read into a visualization unit and be represented.

Besides manual testing by means of an operator, the use of a comparative software tool is also possible and likewise yields the differing error data.

The error data that differ between the groups of GDS error data 6 and 7 can be used to generate a final layout. This can be done after intermediate evaluations but in any event a final layout is generated based at least in part on the outputted error data. A semiconductor device can then be fabricated based upon the final layout. The semiconductor device can be a logic device, such as a processor or a controller, or a memory device, such as a dynamic random access memory or a magnetoresistive memory, as examples.

In one example, fabricating a semiconductor device includes forming metal interconnect lines that electrically couple active elements (e.g., transistors) on a semiconductor substrate, e.g., a monocrystalline substrate or a semiconductor on insulator (SOI) substrate. For example, copper interconnect lines can be formed using a damascene (e.g., dual damascene or single damascene) process. In another example, fabricating a semiconductor device can include forming polysilicon lines (e.g., for transistor gates and/or resistors) and/or forming active areas.

Although the present invention and its advantages have been described in detail, it should be understood that various changes, substitutions and alterations can be made herein without departing from the spirit and scope of the invention as defined by the appended claims.

What is claimed is:

1. A method for monitoring layout changes for semiconductor chips, the method comprising:
   generating a first group of error data by comparing a first layout with wiring and layout rules;
   generating a second group of error data by comparing a second layout with the wiring and layout rules, the second layout being generated from layout changes of the first layout;
   performing a comparison between the first group of error data and the second group of error data; and
   outputting for evaluation only error data that are different in the first and second groups.

2. The method as claimed in claim 1, wherein performing a comparison comprises exclusive-ORing the first and second groups of error data.

3. The method as claimed in claim 1, wherein performing a comparison comprises performing a digital data comparison of the first and second groups of error data.

4. The method as claimed in claim 1, wherein performing a comparison comprises performing an optical comparison.

5. The method as claimed in claim 1, wherein generating the first group of error data further comprises storing the first group of error data in a GDS format and wherein generating the second group of error data further comprises storing the second group of error data in the GDS format.

6. A method of making a semiconductor device, the method comprising:
providing a first layout;
generating a first group of error data by comparing the first layout with wiring and layout rules;
generating a second layout from the first layout;
generating a second group of error data by comparing the second layout with the wiring and layout rules;
performing a comparison between the first group of error data and the second group of error data;
outputting only error data that are different in the first and second groups;
generating a final layout based at least in part on the outputted error data; and
fabricating a semiconductor device based upon the final layout.

7. The method as claimed in claim 6, wherein performing a comparison comprises exclusive-ORing the first and second groups of error data.

8. The method as claimed in claim 6, wherein performing a comparison comprises performing a digital data comparison of the first and second groups of error data.

9. The method as claimed in claim 8, wherein performing a comparison comprises performing a comparison using a processor.

10. The method as claimed in claim 6, wherein performing a comparison comprises performing an optical comparison.

11. The method as claimed in claim 10, wherein performing a comparison comprises performing a manual optical comparison.

12. The method as claimed in claim 10, wherein performing a comparison comprises performing an optical comparison using image processing software.

13. The method as claimed in claim 6, wherein generating the first group of error data further comprises storing the first group of error data in a GDS format and wherein generating the second group of error data further comprises storing the second group of error data in the GDS format.

14. The method as claimed in claim 6, wherein fabricating a semiconductor device comprises forming metal interconnect lines that electrically couple active elements on a semiconductor substrate.

15. The method as claimed in claim 14, wherein forming metal interconnect lines comprises forming copper interconnect lines using a damascene process.

* * * * *